(12) United States Patent
Miura

(10) Patent No.: US 12,444,711 B2
(45) Date of Patent: Oct. 14, 2025

(54) SEMICONDUCTOR DEVICE AND METHOD FOR MANUFACTURING SAME

(71) Applicant: KIOXIA CORPORATION, Tokyo (JP)

(72) Inventor: Masayuki Miura, Ota Tokyo (JP)

(73) Assignee: KIOXIA CORPORATION

(*) Notice: Subject to any disclaimer, the term of this patent is extended or adjusted under 35 U.S.C. 154(b) by 392 days.

(21) Appl. No.: 17/896,796

(22) Filed: Aug. 26, 2022

(65) Prior Publication Data

US 2023/0260966 A1 Aug. 17, 2023

(30) Foreign Application Priority Data

Feb. 15, 2022 (JP) ................................ 2022-021539

(51) Int. Cl.
*H01L 21/683* (2006.01)
*H01L 25/00* (2006.01)
*H01L 25/065* (2023.01)

(52) U.S. Cl.
CPC ...... *H01L 25/0657* (2013.01); *H01L 21/6835* (2013.01); *H01L 25/50* (2013.01); *H01L 2221/68359* (2013.01); *H01L 2225/06506* (2013.01); *H01L 2225/06548* (2013.01); *H01L 2225/06562* (2013.01); *H01L 2225/06586* (2013.01)

(58) Field of Classification Search
CPC . H01L 25/0657; H01L 21/6835; H01L 25/50; H01L 2221/68359; H01L 2225/06506; H01L 2225/06548; H01L 2225/06562; H01L 2225/06586; H01L 25/18; H01L 2225/06524; H01L 2225/06555; H01L 25/03; H01L 21/56; H01L 23/3135; H01L 21/568; H01L 2221/68345; H01L 2221/68372; H01L 21/561; H01L 2225/0651
USPC ......................................................... 257/777
See application file for complete search history.

(56) References Cited

U.S. PATENT DOCUMENTS

| | | | |
|---|---|---|---|
| 5,952,727 A | 9/1999 | Takano et al. | |
| 6,476,503 B1 | 11/2002 | Imamura et al. | |
| 8,178,960 B2 * | 5/2012 | Oh ........................ | H01L 25/105 257/777 |
| 8,331,121 B2 * | 12/2012 | Hong ....................... | G11C 5/06 257/777 |
| 8,492,889 B2 * | 7/2013 | Kim ........................ | H01L 24/32 257/725 |

(Continued)

FOREIGN PATENT DOCUMENTS

| | | | |
|---|---|---|---|
| JP | H06-302645 A | 10/1994 | |
| JP | H07-254654 A | 10/1995 | |

(Continued)

*Primary Examiner* — Vu A Vu
(74) *Attorney, Agent, or Firm* — Foley & Lardner LLP

(57) ABSTRACT

A semiconductor device includes a first stacked body provided above a substrate, and including a plurality of first semiconductor chips stacked on top of one another; and a second stacked body provided further above the first stacked body, and including a plurality of second semiconductor chips stacked on top of one another. The first semiconductor chips each have a first pad facing toward the substrate, and the second semiconductor chips each have a second pad facing away from the substrate.

15 Claims, 9 Drawing Sheets

(56) References Cited

U.S. PATENT DOCUMENTS

| | | | |
|---|---|---|---|
| 8,664,757 B2* | 3/2014 | Cho | H01L 21/568 |
| | | | 257/686 |
| 8,680,687 B2* | 3/2014 | Co | H01L 24/24 |
| | | | 257/777 |
| 8,729,689 B2* | 5/2014 | Hwang | H01L 23/538 |
| | | | 257/777 |
| 8,922,005 B2 | 12/2014 | Hu et al. | |
| 9,293,449 B2 | 3/2016 | Hu et al. | |
| 9,502,390 B2 | 11/2016 | Caskey et al. | |
| 9,716,080 B1 | 7/2017 | Chuang et al. | |
| 9,761,568 B2 | 9/2017 | Fang et al. | |
| 10,153,247 B2 | 12/2018 | Colosimo et al. | |
| 10,256,208 B2* | 4/2019 | Zhao | H01L 24/08 |
| 10,297,582 B2 | 5/2019 | Caskey et al. | |
| 10,435,290 B2 | 10/2019 | Cachia et al. | |
| 10,490,527 B2 | 11/2019 | Geissler et al. | |
| 10,629,561 B2* | 4/2020 | Zhao | H01L 24/08 |
| 10,756,072 B2 | 8/2020 | Guo | |
| 10,796,975 B2* | 10/2020 | Mao | H01L 24/29 |
| 10,861,826 B2* | 12/2020 | Oh | H01L 23/5385 |
| 10,930,622 B2 | 2/2021 | Ding et al. | |
| 10,991,679 B2 | 4/2021 | Ding et al. | |
| 11,309,301 B2* | 4/2022 | Zhou | H01L 25/50 |
| 11,652,090 B2* | 5/2023 | Bae | H01L 25/105 |
| | | | 257/686 |
| 11,990,449 B2* | 5/2024 | Kim | H01L 25/0657 |
| 2009/0085222 A1* | 4/2009 | Yamano | H01L 23/585 |
| | | | 257/E23.116 |
| 2009/0115049 A1 | 5/2009 | Shiraishi et al. | |
| 2010/0193930 A1* | 8/2010 | Lee | H01L 24/24 |
| | | | 257/E23.173 |
| 2015/0132888 A1 | 5/2015 | Colosimo et al. | |
| 2017/0040280 A1 | 2/2017 | Colosimo et al. | |
| 2021/0098425 A1 | 4/2021 | Lee et al. | |

FOREIGN PATENT DOCUMENTS

| | | |
|---|---|---|
| JP | H09-260428 A | 10/1997 |
| JP | 2000-068402 A | 3/2000 |
| JP | 3768817 B2 | 4/2006 |
| JP | 2006-310649 A | 11/2006 |
| JP | 4260672 B2 | 4/2009 |
| JP | 4526651 B2 | 8/2010 |
| JP | 2010-192928 A | 9/2010 |
| JP | 4926787 B2 | 5/2012 |
| JP | 5333337 B2 | 11/2013 |
| TW | 200921860 A | 5/2009 |
| TW | 201115659 A1 | 5/2011 |

\* cited by examiner

SEMICONDUCTOR DEVICE AND METHOD FOR MANUFACTURING SAME

CROSS-REFERENCE TO RELATED APPLICATION(S)

This application is based upon and claims the benefit of priority from Japanese Patent Application No. 2022-021539, filed Feb. 15, 2022, the entire contents of which are incorporated herein by reference.

FIELD

Embodiments described herein relate generally to a semiconductor device and a method for manufacturing the same.

BACKGROUND

A semiconductor package may include a plurality of stacked semiconductor chips. Such vertically stacked semiconductor chips may be laterally shifted to expose pads for connection to wires. In order to reduce a size of the package, it is desired to reduce arrangement areas of the semiconductor chips.

DETAILED DESCRIPTION

Figure 1:
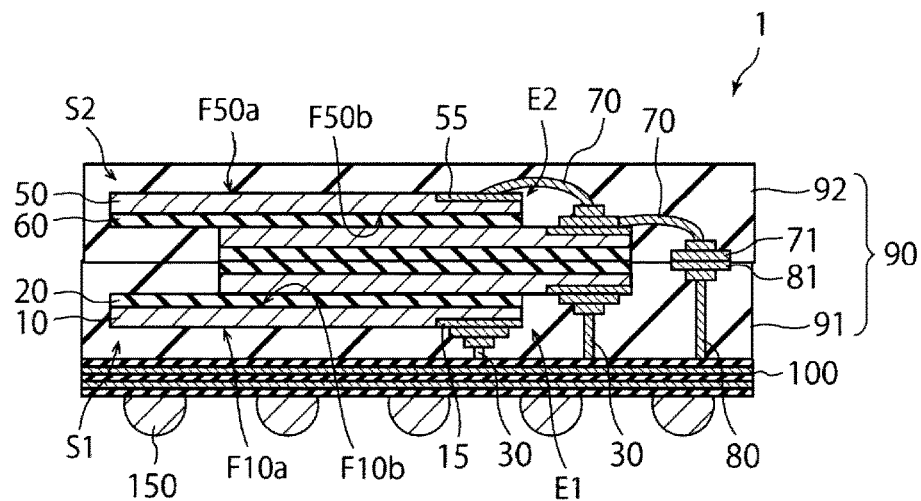
FIG. 1 is a cross-sectional view showing an example of a configuration of a semiconductor device according to a first embodiment.
Figure 1:
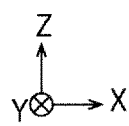

Embodiments provide a semiconductor device capable of reducing a size of a package and a method for manufacturing the same.

In general, according to one embodiment, a semiconductor device includes a first stacked body provided above a substrate, and including a plurality of first semiconductor chips stacked on top of one another; and a second stacked body provided further above the first stacked body, and including a plurality of second semiconductor chips stacked on top of one another. The first semiconductor chips each have a first pad facing toward the substrate, and the second semiconductor chips each have a second pad facing away from the substrate.

Hereinafter, embodiments will be described with reference to the drawings. The present embodiment is not intended to limit the present disclosure. In the following embodiments, an up-down direction of a substrate indicates a relative direction when a surface on which a semiconductor chip is provided is on an upper side, and may be different from an up-down direction according to a gravitational acceleration. The drawings are schematic or conceptual, and a proportion and the like of each portion are not necessarily the same as actual ones. In the specification and the drawings, components similar to those previously described with reference to preceding drawings are denoted by the same reference numerals, and a detailed description thereof will be appropriately omitted.

First Embodiment

FIG. 1 is a cross-sectional view showing an example of a configuration of a semiconductor device 1 according to a first embodiment. The semiconductor device 1 includes a stacked body S1, columnar electrodes 30, a stacked body S2, wires 70, a columnar electrode 80, a resin layer 90, a redistribution layer 100, and metal bumps 150. The semiconductor device 1 may be, for example, a semiconductor package such as a NAND flash memory or a large scale integration (LSI).

The stacked body S1 is provided on the redistribution layer 100. The stacked body S1 includes semiconductor chips 10 and adhesive layers 20. The adhesive layers 20 are, for example, die attachment films (DAF). The stacked body S1 is a stacked body in which the semiconductor chips 10 are stacked while being shifted in a direction perpendicular to a stacking direction.

Each of the semiconductor chips 10 has a first surface F10a and a second surface F10b opposite to the first surface F10a. A semiconductor element (not shown) such as a memory cell array, a transistor, or a capacitor is formed on the first surface F10a of the semiconductor chip 10. The semiconductor element on the first surface F10a of the semiconductor chip 10 is covered and protected by an insulating film (not shown). As the insulating film, for example, an inorganic insulating material such as a silicon oxide film or a silicon nitride film is used. In addition, as the insulating film, a material obtained by forming an organic insulating material on an inorganic insulating material may be used. As the organic insulating material, an organic insulating material, for example, a resin such as a phenol resin, a polyimide resin, a polyamide resin, an acrylic resin, an epoxy resin, a p-phenylene benzobisoxazole (PBO) resin, a silicone resin, and a benzocyclobutene resin, or a mixed material or a composite material thereof is used. The semiconductor chip 10 may be a semiconductor chip on which a memory chip such as a NAND flash memory or any LSI is mounted. The semiconductor chips 10 may be have the same configuration, or may be have different configurations.

The semiconductor chips 10 are stacked and bonded by the adhesive layers 20. As the adhesive layers 20, an organic insulating material, for example, a resin such as a phenol resin, a polyimide resin, a polyamide resin, an acrylic resin, an epoxy resin, a p-phenylene benzobisoxazole (PBO) resin, a silicone resin, and a benzocyclobutene resin, or a mixed material or a composite material thereof is used. Each of the semiconductor chips 10 has an electrode pad 15 exposed on the first surface F10a. Other semiconductor chips 10 (lower semiconductor chips 10) stacked under the semiconductor chips 10 (upper semiconductor chips 10) are stacked in a staggered manner so as not to overlap the electrode pads 15 of the upper semiconductor chips 10 in a direction (X direction) substantially perpendicular to a side where the electrode pads 15 of the upper semiconductor chips 10 are provided.

Each electrode pad 15 is electrically connected to one of the semiconductor elements provided in the semiconductor chip 10. As the electrode pad 15, for example, a simple substance such as Cu, Ni, W, Au, Ag, Pd, Sn, Bi, Zn, Cr, Al, Ti, Ta, TiN, TaN, and CrN, a composite film containing two or more kinds of these, or a low-resistance metal such as an alloy containing two or more kinds of these is used.

The columnar electrode (second columnar electrode) 30 is connected to the electrode pad 15 of the semiconductor chip 10 and extends in a stacking direction (Z direction) of the semiconductor chips 10. Each adhesive layer 20 is partially removed to expose a part of the electrode pad 15, and the columnar electrode 30 can be connected to the electrode pad 15. Alternatively, the adhesive layer 20 is attached to the second surface F10b of the lower semiconductor chip 10 and is provided so as not to overlap the electrode pad 15 of the upper semiconductor chip 10. An upper end of the columnar electrode 30 is connected to the electrode pad 15 by, for example, a wire bonding method. A lower end of the columnar electrode 30 reaches a lower surface of the resin layer 90 and is exposed on the lower surface. The lower end of the columnar electrode 30 is connected to an electrode pad (not shown) of the redistribution layer 100. As the material of the columnar electrode 30, for example, a conductive metal such as Au, Cu, Ag, Pd, Pt, or an alloy containing at least one kind of these is used.

The electrode pad 15 faces the redistribution layer 100. Therefore, the semiconductor chips 10 are stacked face-down. The semiconductor chips 10 of the stacked body S1 are stacked while being shifted to expose the electrode pads 15.

The stacked body S2 is provided on an opposite side of the redistribution layer 100 with respect to the stacked body S1. The stacked body S2 includes semiconductor chips 50 and adhesive layers 60. The adhesive layers 60 are, for example, DAFs. The stacked body S2 is a stacked body in which the semiconductor chips 50 are stacked while being shifted in a direction perpendicular to a stacking direction.

Each of the semiconductor chips 50 has a first surface F50a and a second surface F50b opposite to the first surface F50a. A semiconductor element (not shown) such as a memory cell array, a transistor, or a capacitor is formed on the first surface F50a of the semiconductor chip 50. The semiconductor element on the first surface F50a of the semiconductor chip 50 is covered and protected by an insulating film (not shown). As the insulating film, for example, an inorganic insulating material such as a silicon oxide film or a silicon nitride film is used. In addition, as the insulating film, a material obtained by forming an organic insulating material on an inorganic insulating material may be used. As the organic insulating material, an organic insulating material, for example, a resin such as a phenol resin, a polyimide resin, a polyamide resin, an acrylic resin, an epoxy resin, a p-phenylene benzobisoxazole (PBO) resin, a silicone resin, and a benzocyclobutene resin, or a mixed material or a composite material thereof is used. The semiconductor chip 50 may be a semiconductor chip on which a memory chip such as a NAND flash memory or any LSI is mounted. The semiconductor chips 50 may be have the same configuration, or may be have different configurations. Further, the semiconductor chip 50 may be a semiconductor chip having a configuration same as that of the semiconductor chip 10, or may be a semiconductor chip having a configuration different from that of the semiconductor chip 10.

The semiconductor chips 50 are stacked and bonded by the adhesive layers 60. Each of the semiconductor chips 50 includes an electrode pad 55 exposed on the first surface F50a. The semiconductor chips 50 stacked on other semiconductor chips 50 are stacked in a staggered manner so as not to overlap the electrode pads 55 of other semiconductor chips 50 in a direction (X direction) substantially perpendicular to a side where the electrode pads 55 are provided.

Each electrode pad 55 is electrically connected to one of the semiconductor element provided in the semiconductor chip 50. As the electrode pad 55, for example, a simple substance such as Cu, Ni, W, Au, Ag, Pd, Sn, Bi, Zn, Cr, Al, Ti, Ta, TiN, TaN, and CrN, a composite film containing two or more kinds of these, or a low-resistance metal such as an alloy containing two or more kinds of these is used.

The wires (first wire) 70 are connected to the electrode pads 55 of the semiconductor chips 50. The wires 70 electrically connect the electrode pads 55, and also electrically connect the electrode pad 55 and the columnar electrode 80 (end pad 81). The wires 70 are, for example, loop-shaped wires. Each adhesive layer 60 is partially removed to expose a part of the electrode pad 55, and the wire 70 can be connected to the electrode pad 55. Alternatively, the adhesive layer 60 is attached to the second surface F50b of the upper semiconductor chip 50 and is provided so as not to overlap the electrode pad 55 of the lower semiconductor chip 50. As the material of the wire 70, for example, a conductive metal such as Au, Cu, Ag, Pd, Pt, or an alloy containing at least one kind of these is used.

The electrode pad 55 faces a direction opposite to the redistribution layer 100. Therefore, the semiconductor chips 50 are stacked face-up. That is, the semiconductor chips 50 are stacked back to back with the semiconductor chips 10 stacked face-down. The semiconductor chips 50 of the stacked body S2 are stacked while being shifted to expose the electrode pads 55.

The columnar electrode (first columnar electrode) 80 extends from the redistribution layer 100 in the stacking direction (upward) of the stacked body S1 and the stacked body S2. The columnar electrode 80 penetrates the resin layer 90 and extends to a predetermined height inside the resin layer 90. More specifically, the columnar electrode 80 penetrates a resin layer 91 of the resin layer 90 in the stacking direction of the stacked bodies S1 and S2, and extends to a boundary between the resin layer 91 and a resin layer 92 in the resin layer 90. As the material of the columnar electrode 80, for example, a conductive metal such as Au, Cu, Ag, Pd, Pt, or an alloy containing at least one kind of these is used.

The columnar electrode 80 includes an end pad 81 at an end opposite to the redistribution layer 100. The wire 70 includes an end pad 71 at an end on a columnar electrode 80 side. The end pad 81 and the end pad 71 are in contact with each other at the boundary between the resin layers 91 and 92, which will be described later. A width of the end pad 81 is different from a width of the end pad 71. More specifically, the width of the end pad 81 is larger than the width of the end pad 71. The connection between the wire 70 and the columnar electrode 80 can be facilitated by increasing the width (diameter) of the end pad 81 (see FIG. 2H). For example, the width of the end pad 81 can be increased by increasing a bonding load when forming the columnar electrode 80. The width of the end pad 81 and the width of the end pad 71 are widths in a direction (X direction) substantially perpendicular to the Z direction in which the columnar electrode 80 extends.

The columnar electrode 80 is disposed at a side E1 where the electrode pad 15 is disposed in the semiconductor chip 10.

The electrode pad 55 is disposed at a side E2 of the semiconductor chip 50, which is at the side E1 where the electrode pad 15 is disposed in the semiconductor chip 10. In the example shown in FIG. 1, the electrode pad 15 is disposed at a right end of the semiconductor chip 10, and the electrode pad 55 is disposed at a right end of the semiconductor chip 50.

The stacked body S2 is in contact with the stacked body S1. The uppermost semiconductor chip 10 in the stacked body S1 and the lowermost semiconductor chip 50 in the stacked body S2 are bonded to each other via the adhesive layers 20 and 60.

The stacked bodies S1 and S2, the columnar electrodes 30, the wires 70, and the columnar electrodes 80 are covered (sealed) with the resin layer 90, and tips of the columnar electrodes 30 and 80 are exposed on a lower surface.

As the resin layer 90, an organic insulating material, for example, a resin such as a phenol resin, a polyimide resin, a polyamide resin, an acrylic resin, an epoxy resin, a p-phenylene benzobisoxazole (PBO) resin, a silicone resin, and a benzocyclobutene resin, or a mixed material or a composite material thereof is used.

The resin layer 90 includes the resin layers 91 and 92.

The resin layer 91 is provided on the redistribution layer 100. The stacked body S1 and the columnar electrodes 30 and 80 are covered with the resin layer 91.

The resin layer 92 is provided on the resin layer 91. The stacked body S2 and the wires 70 are covered with the resin layer 92.

The first resin layer 91 and the second resin layer 92 may be the same in material and properties. Alternatively, the first resin layer 91 and the second resin layer 92 may be different in material and properties. Accordingly, warpage of a package of the semiconductor device 1 can be prevented. The first resin layer 91 and the second resin layer 92 are different in at least one of a curing shrinkage ratio, an elastic modulus, a linear expansion coefficient, and a glass transition point (Tg). The resin layer 91 and the resin layer 92 may be formed of a so-called mold resin. In the resin layer, the mold resin is mixed with a filler of an inorganic insulating material. The resin layer 91 and the resin layer 92 may be different in a mixing ratio of the filler and the resin, a material of the filler, a shape of the filler, a diameter of the filler, and the like.

The redistribution layer (RDL) 100 is provided below the resin layer 90 and is electrically connected to the columnar electrodes 30 and 80. The redistribution layer 100 is a multilayer interconnection layer in which a plurality of interconnection layers and a plurality of insulating layers are stacked, and electrically connects the columnar electrodes 30 and 80 to the metal bumps 150.

Each metal bump 150 is provided below the redistribution layer 100 and is electrically connected to the interconnection layer of the redistribution layer 100. The metal bump 150 is used for connection with an external device (not shown). As the metal bump 150, for example, a simple substance of Sn, Ag, Cu, Au, Pd, Bi, Zn, Ni, Sb, In, and Ge, or a composite film or an alloy containing two or more kinds of these is used.

Next, a method for manufacturing the semiconductor device 1 will be described.

FIGS. 2A to 2I are cross-sectional views showing an example of the method for manufacturing the semiconductor device 1 according to the first embodiment.

Figure 2A:
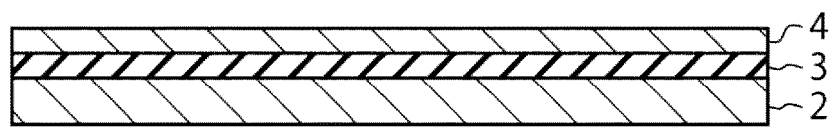
FIG. 2A is a cross-sectional view showing an example of a method for manufacturing a semiconductor device according to the first embodiment.

First, as shown in FIG. 2A, a peeling layer 3 and a metal film 4 are formed on a support 2. The support 2 is, for example, a silicon (Si) substrate. The support 2 may be a glass substrate or the like. The peeling layer 3 is, for example, a temporary adhesive made of an organic material. The metal film 4 is, for example, a Ti/Al layer. The metal film 4 is formed by, for example, sputtering. By forming the metal film 4, the columnar electrode 80 can be easily formed on the support 2 in a later step. From a step shown in FIG. 2B until the support 2 is peeled off, the peeling layer 3 and the metal film 4 are omitted.

Figure 2B:
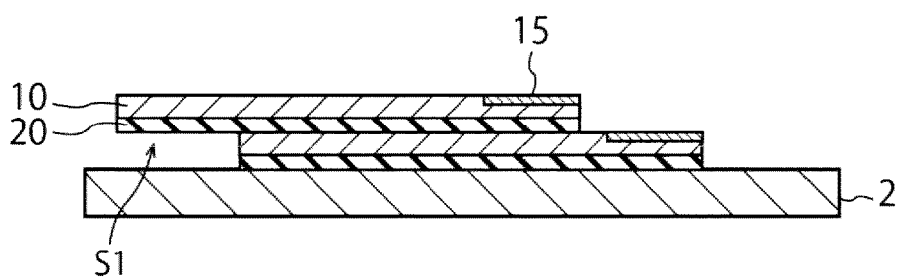
FIG. 2B is a cross-sectional view showing an example of the method for manufacturing a semiconductor device, following FIG. 2A.

Next, as shown in FIG. 2B, the semiconductor chips 10 are stacked on the support 2 (metal film 4). Accordingly, the stacked body S1 is formed on the support 2. The electrode pad 15 each of the semiconductor chips 10 faces a direction opposite to the support 2.

Figure 2C:
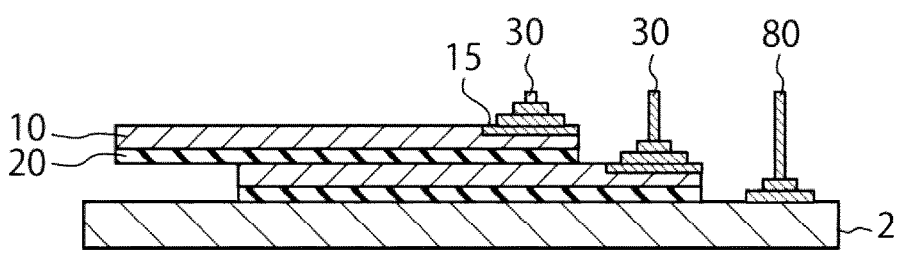
FIG. 2C is a cross-sectional view showing an example of the method for manufacturing a semiconductor device, following FIG. 2B.

Next, as shown in FIG. 2C, the columnar electrodes 30 and 80 are formed. The columnar electrodes 30 and 80 are formed by, for example, a wire bonding method. The columnar electrode 30 extends upward (in the stacking direction of the stacked body S1) from the electrode pad 15. The columnar electrode 80 extends from the support 2 (metal film 4) in the stacking direction of the stacked body S1.

Figure 2D:
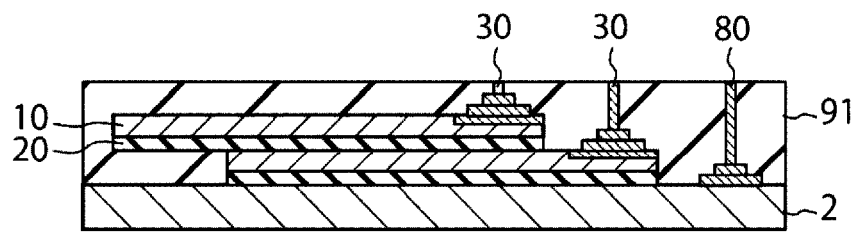
FIG. 2D is a cross-sectional view showing an example of the method for manufacturing a semiconductor device, following FIG. 2C.

Next, as shown in FIG. 2D, the resin layer 91 is formed on the support 2, and the resin layer 91 is ground such that upper ends of the columnar electrodes 30 and 80 are exposed. The resin layer 91 covers the stacked body S1.

Figure 2E:
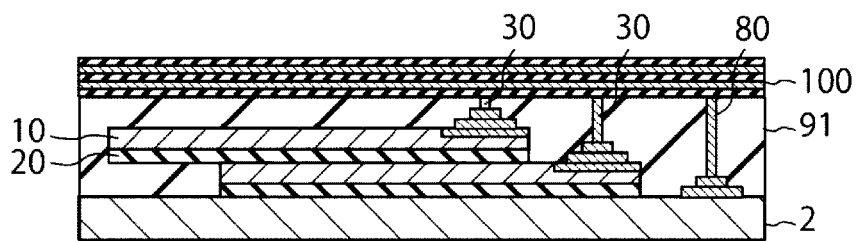
FIG. 2E is a cross-sectional view showing an example of the method for manufacturing a semiconductor device, following FIG. 2D.

Next, as shown in FIG. 2E, the redistribution layer 100 is formed.

Figure 2F:
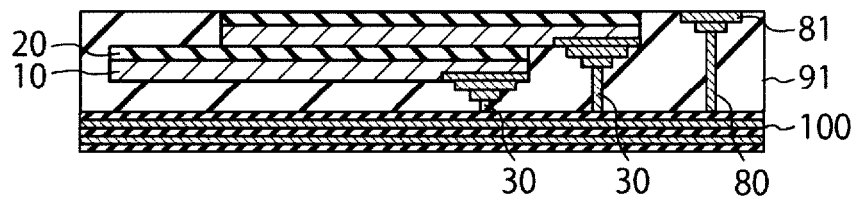
FIG. 2F is a cross-sectional view showing an example of the method for manufacturing a semiconductor device, following FIG. 2E.

Next, as shown in FIG. 2F, the support 2 and the peeling layer 3 are peeled off, the surface after peeling is cleaned, and the metal film 4 is removed by etching. FIG. 2F is shown upside down from FIG. 2E. After the step shown in FIG. 2F, the resin layer 91, the adhesive layer 20, and the end pad 81 are exposed on the surface after the support 2 is peeled off.

Figure 2G:
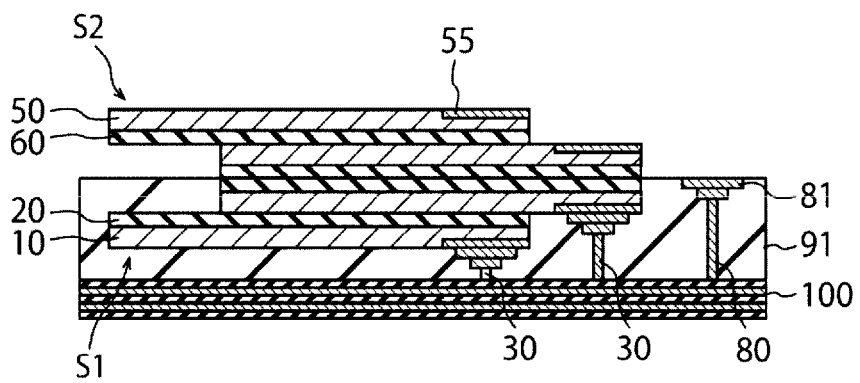
FIG. 2G is a cross-sectional view showing an example of the method for manufacturing a semiconductor device, following FIG. 2F.

Next, as shown in FIG. 2G, the semiconductor chips 50 are stacked on the stacked body S1. Accordingly, the stacked body S2 is formed on the stacked body S1 on a side from which the support 2 is peeled off. The electrode pad 55 of each of the semiconductor chips 50 faces a direction opposite to the stacked body S1.

Figure 2H:
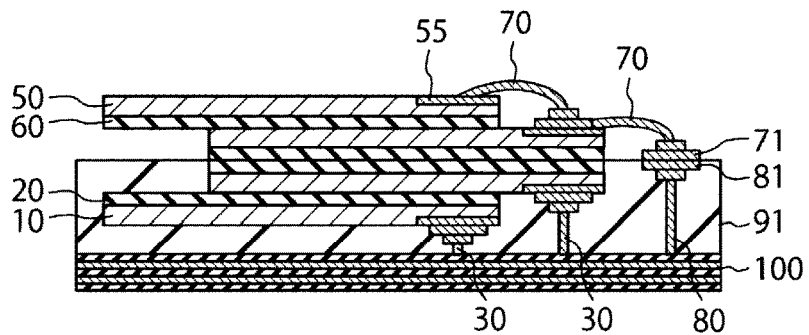
FIG. 2H is a cross-sectional view showing an example of the method for manufacturing a semiconductor device, following FIG. 2G.

Next, as shown in FIG. 2H, the wires 70 are formed. The wires 70 are formed by, for example, a wire bonding method. The wires 70 electrically connect the electrode pads 55 and electrically connect the electrode pad 55 and the columnar electrode 80 (end pad 81).

Figure 2I:
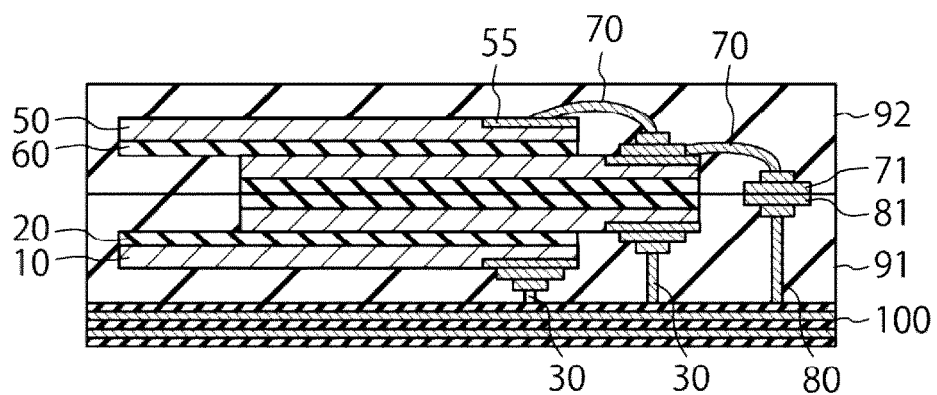
FIG. 2I is a cross-sectional view showing an example of the method for manufacturing a semiconductor device, following FIG. 2H.

Next, as shown in FIG. 2I, the resin layer 92 is formed on the resin layer 91. The resin layer 92 covers the stacked body S2.

After the step shown in FIG. 2I, the metal bumps 150 are formed. Thus, the semiconductor device 1 shown in FIG. 1 is completed.

As described above, according to the first embodiment, each semiconductor chip 10 provided in the stacked body S1 includes the electrode pad 15 facing the redistribution layer 100. Each semiconductor chip 50 provided in the stacked body S2 includes the electrode pad 55 facing the direction opposite to the redistribution layer 100 (stacked body S1). Accordingly, the semiconductor chips 10 and 50 can be easily disposed such that an overlapping area of the stacked bodies S1 and S2 becomes large when viewed from the stacking direction. As a result, a size of the package can be reduced.

The maximum length of the columnar electrodes 30 and 80 can be made shorter. Accordingly, the columnar electrodes 30 and 80 can be formed at a narrower pitch.

In the first embodiment, the stacked bodies S1 and S2 have the same number of layers. The necessary arrangement area can be minimized by placing the stacked bodies S1 and S2 such that the areas of the stacked bodies S1 and S2 are substantially the same and outer shapes of the stacked bodies S1 and S2 overlap each other when viewed from the stacking direction. However, the stacked bodies S1 and S2 may have different numbers of layers.

In the first embodiment, the number of layers of the stacked bodies S1 and S2 is 2, and the number of layers may be 3 or more.

The support 2 may be a metal plate. In this case, even if the metal film 4 is not formed, the columnar electrode 80 can be easily formed. The support 2 which is a metal plate may be peeled off by, for example, melting the support 2.

Comparative Examples

Next, comparative examples will be described in which all electrode pads face the same direction, that is, semiconductor chips are in either a face-down state or a face-up state.

Figure 3:
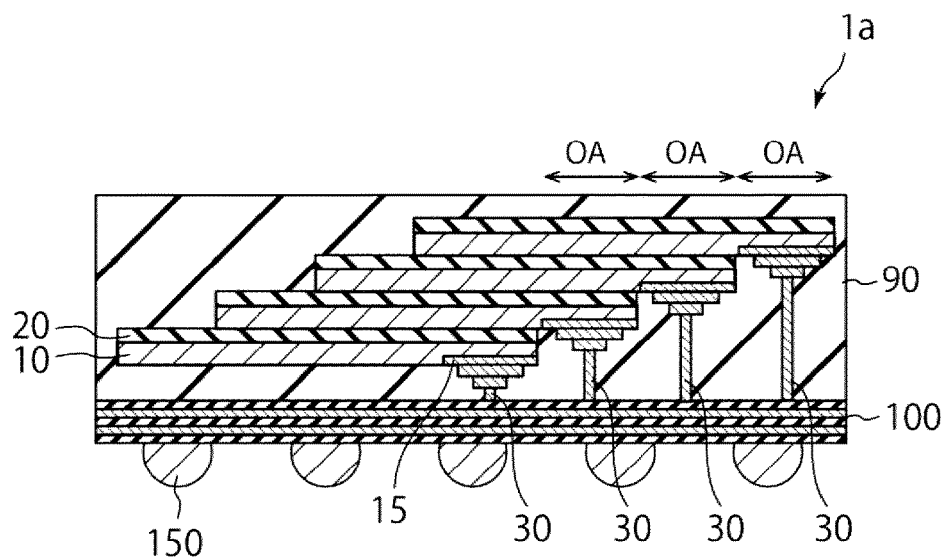
FIG. 3 is a cross-sectional view showing an example of a configuration of a semiconductor device according to a first comparative example.
Figure 4:
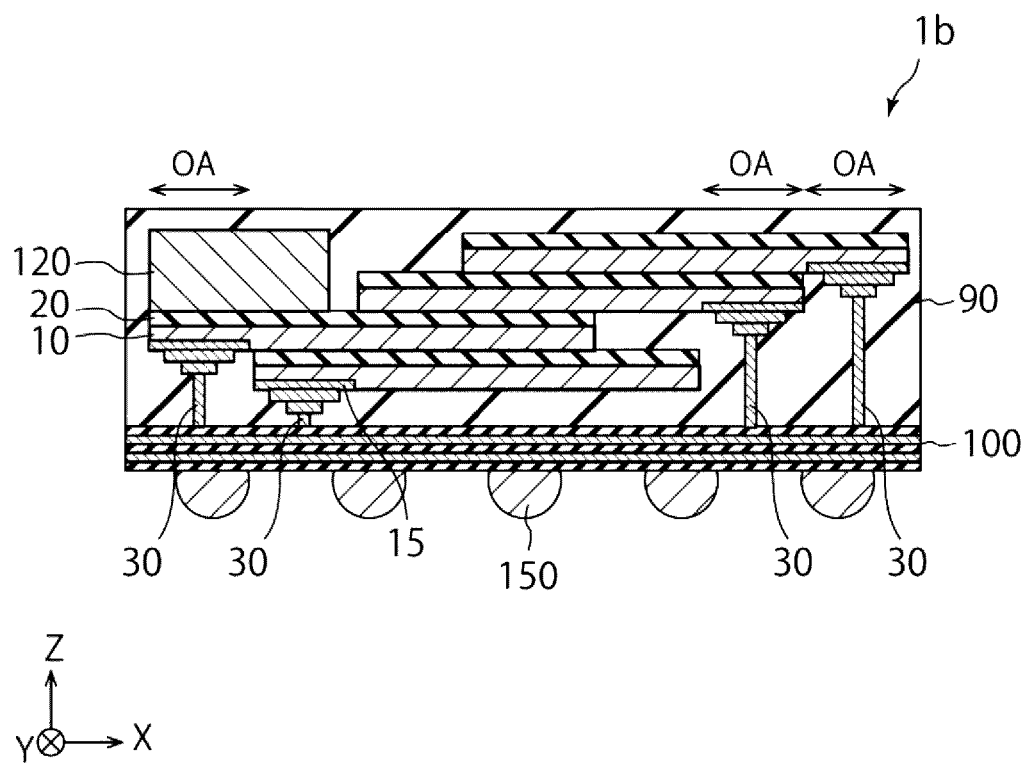
FIG. 4 is a cross-sectional view showing an example of a configuration of a semiconductor device according to a second comparative example.

FIG. 3 is a cross-sectional view showing an example of a configuration of a semiconductor device 1a according to a first comparative example. FIG. 4 is a cross-sectional view showing an example of a configuration of a semiconductor device 1b according to a second comparative example.

In the examples shown in FIGS. 3 and 4, four layers of the semiconductor chips 10 are shown. The number of semiconductor chips is the same in the first embodiment, the first comparative example, and the second comparative example. In the examples shown in FIGS. 3 and 4, the resin layer 90 has one type of resin layer.

In the examples shown in FIGS. 3 and 4, all the semiconductor chips 10 are stacked face-down. In the example shown in FIG. 3, the semiconductor chips 10 are stacked while being shifted in one direction. In the example shown in FIG. 4, the semiconductor chips 10 are stacked while being shifted to be folded back in the middle by a spacer 120.

A shift amount OA is an amount of the offset (shift) of the semiconductor chip 10 for exposing the electrode pad 15. In the examples shown in FIGS. 3 and 4, a necessary arrangement area is a sum of an area of one semiconductor chip 10 and an area corresponding to three times the shift amount OA. Each time the number of layers of the semiconductor chip 10 increases by one, an arrangement area of the area corresponding to the shift amount OA is required. In the folded structure shown in FIG. 4, it is difficult to reduce the shift amount OA.

The maximum length of the columnar electrode 30 needs to be increased according to the number of layers. The longer the columnar electrode 30, the more difficult it is to form the columnar electrode 30. This is because a capillary forming the columnar electrode 30 may come into contact with other columnar electrodes 30 already formed. In this case, it is difficult to form the columnar electrodes 30 at a narrow pitch.

In contrast, in the first embodiment, the stacked body S1 in the face-down state and the stacked body S2 in the face-up state are mixed. The stacked body S1 and the stacked body S2 each include two layers of semiconductor chips. In the example shown in FIG. 1, a necessary arrangement area is a sum of an area of one semiconductor chip 10, an area of one semiconductor chip 50, an area according to the shift amount OA, and an arrangement area of the columnar electrode 80. Every time the number of layers of both the semiconductor chip 10 and the semiconductor chip 50 increases by one, an arrangement area of the area corresponding to the shift amount OA is required. Therefore, as compared with the first comparative example and the second comparative example, an area due to the offset of the semiconductor chips 10 and 50 can be reduced, and the necessary arrangement area can be reduced. Accordingly, the size of the package can be reduced.

In the first embodiment, the maximum length of the columnar electrodes 30 and 80 is determined by a height (the number of layers) of the lower stacked body S1. That is, since the columnar electrodes 30 and 80 are not directly connected to the semiconductor chip 50 of the stacked body S2, the maximum length of the columnar electrodes 30 and 80 is not influenced by the number of layers in the upper stacked body S2. Therefore, it is possible to shorten the maximum length of the columnar electrodes 30 and 80 as compared with the first comparative example and the second comparative example. Accordingly, the columnar electrodes 30 and 80 can be easily formed at a narrower pitch.

Second Embodiment

Figure 5:
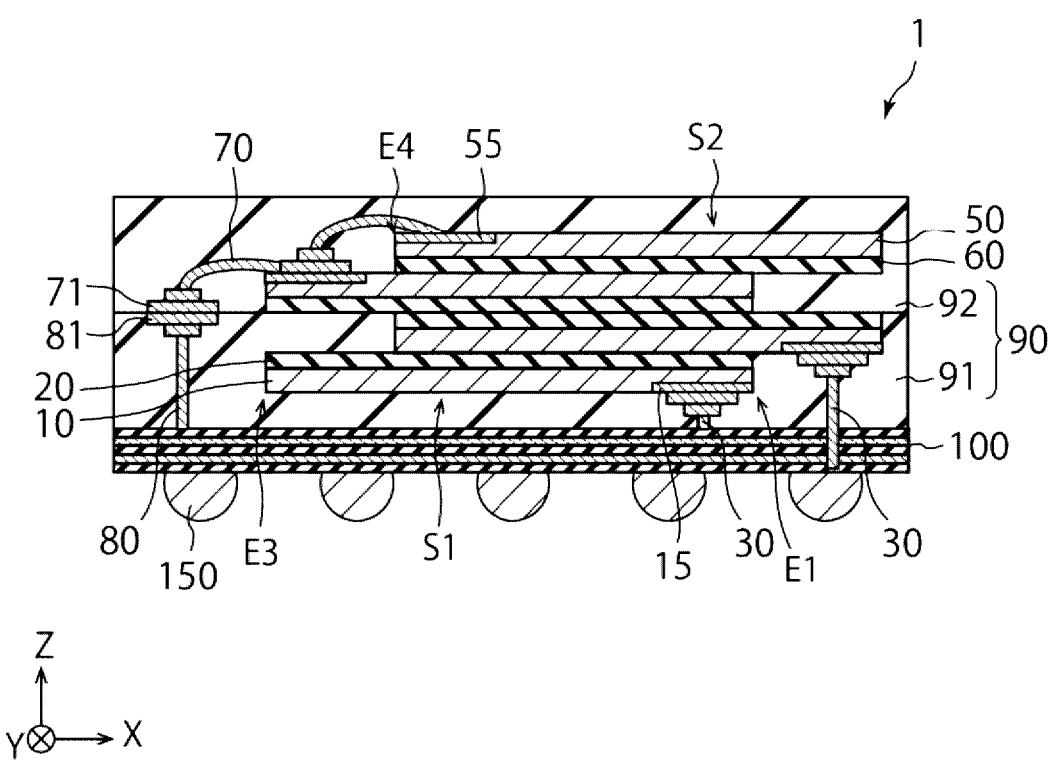
FIG. 5 is a cross-sectional view showing an example of a configuration of a semiconductor device according to a second embodiment.

FIG. 5 is a cross-sectional view showing an example of a configuration of the semiconductor device 1 according to a second embodiment. In the second embodiment, the arrangement of the columnar electrode 80 is different from that in the first embodiment.

The columnar electrode 80 is disposed at a side E3 opposite to the side E1 where the electrode pad 15 is disposed in the semiconductor chip 10. By changing the arrangement of the columnar electrode 80, the stacking direction of the stacked body S2 and the arrangement of the electrode pad 55 are changed. The semiconductor chip 50 and the electrode pad 55 are disposed point-symmetrically with respect to the semiconductor chip 10 and the electrode pad 15 about the stacked bodies S1 and S2.

The electrode pad 55 is disposed at a side E4 of the semiconductor chip 50, which is at the side E3 opposite to the side E1 where the electrode pad 15 is disposed in the semiconductor chip 10. In the example shown in FIG. 5, the electrode pad 15 is disposed at the right end of the semiconductor chip 10, and the electrode pad 55 is disposed at a left end of the semiconductor chip 50.

Since other configurations of the semiconductor device 1 according to the second embodiment are the same as corresponding configurations of the semiconductor device 1 according to the first embodiment, a detailed description thereof will be omitted.

As in the second embodiment, the arrangement of the columnar electrode 80 may be changed. The semiconductor device 1 according to the second embodiment can obtain the effect same as that of the first embodiment.

Third Embodiment

Figure 6:
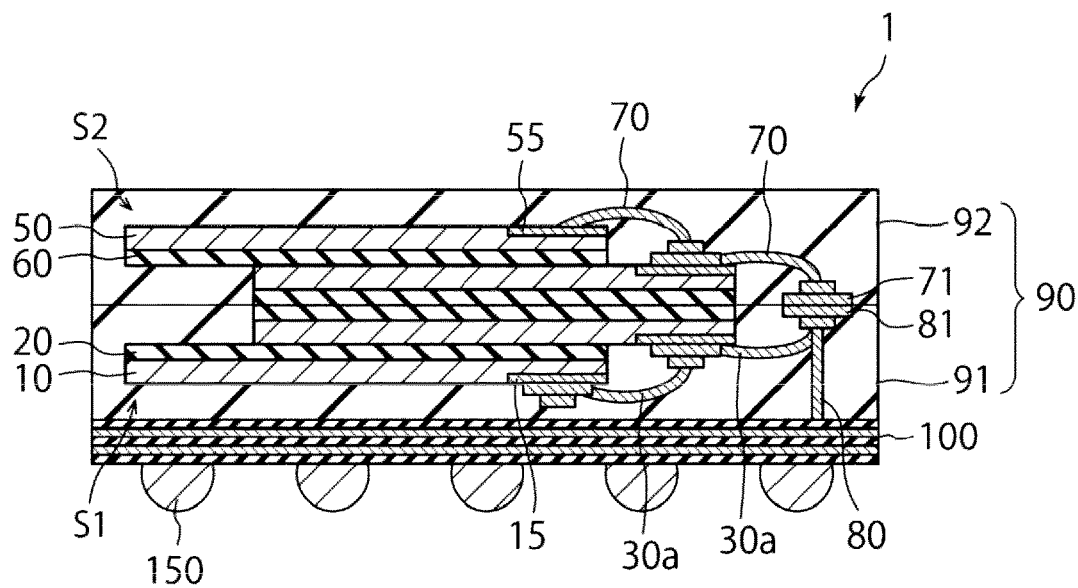
FIG. 6 is a cross-sectional view showing an example of a configuration of a semiconductor device according to a third embodiment.

FIG. 6 is a cross-sectional view showing an example of a configuration of the semiconductor device 1 according to a third embodiment. The third embodiment is different from the first embodiment in that wires 30a are provided instead of the columnar electrodes 30.

The semiconductor device 1 further includes the wires (second wire) 30a.

The wires 30a electrically connect the electrode pads 15, and also electrically connect the electrode pad 15 and the columnar electrode 80 (end pad 81). The wires 30a are, for example, loop-shaped wires.

Since other configurations of the semiconductor device 1 according to the third embodiment are the same as corresponding configurations of the semiconductor device 1 according to the first embodiment, a detailed description thereof will be omitted.

As in the third embodiment, the wires 30a may be provided instead of the columnar electrodes 30. The semiconductor device 1 according to the third embodiment can obtain the effect same as that of the first embodiment.

Fourth Embodiment

Figure 7:
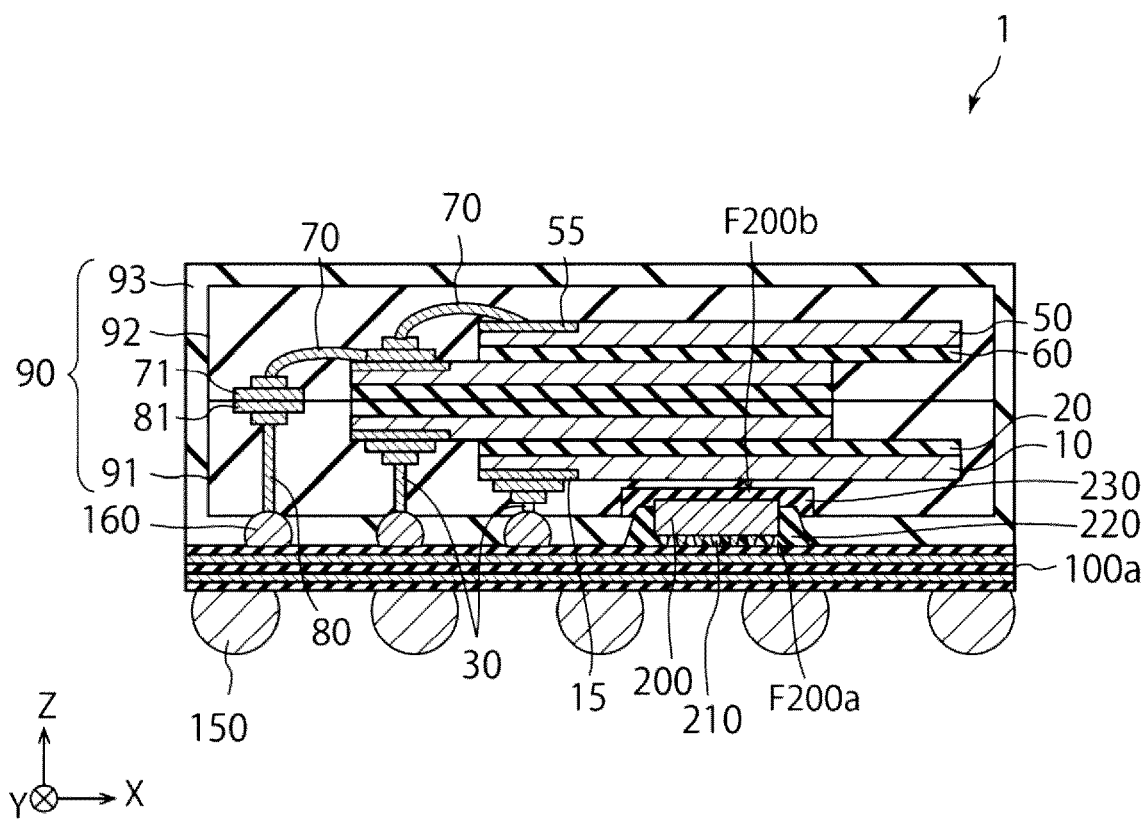
FIG. 7 is a cross-sectional view showing an example of a configuration of a semiconductor device according to a fourth embodiment.

FIG. 7 is a cross-sectional view showing an example of a configuration of the semiconductor device 1 according to a fourth embodiment. In the fourth embodiment, as compared with the first embodiment, an interconnection substrate 100a is provided instead of the redistribution layer 100, and semiconductor chips 200 is further provided.

The semiconductor device 1 further includes the interconnection substrate 100a, the semiconductor chips 200, a metal bump 210, an underfill 220, an adhesive 230, and metal bumps 160.

The interconnection substrate 100a is a multilayer substrate including an interconnection layer and an insulating layer. The insulating layer is, for example, a prepreg. The insulating layer is, for example, a composite material of a fibrous reinforcing material such as glass cloth and a thermosetting resin such as epoxy.

Each of the semiconductor chips 200 includes a first surface F200a and a second surface F200b opposite to the first surface F200a. A semiconductor element (not shown) such as a transistor or a capacitor is formed on the first surface F200a of the semiconductor chip 200. The semiconductor element on the first surface F200a of the semiconductor chip 200 is covered and protected by an insulating film (not shown). As the insulating film, for example, an inorganic insulating material such as a silicon oxide film or a silicon nitride film is used. In addition, as the insulating film, a material obtained by forming an organic insulating material on an inorganic insulating material may be used. As the organic insulating material, an organic insulating material, for example, a resin such as a phenol resin, a polyimide resin, a polyamide resin, an acrylic resin, an epoxy resin, a p-phenylene benzobisoxazole (PBO) resin, a silicone resin, and a benzocyclobutene resin, or a mixed material or a composite material thereof is used. The semiconductor chip 200 may be, for example, a controller chip that controls memory chips (semiconductor chips 10 and 50) or a semiconductor chip on which any LSI is mounted.

The semiconductor chip 200 is provided on the interconnection substrate 100a. The semiconductor chip 200 includes the metal bump 210 on the first surface F200a.

The metal bump 210 is connected to an electrode pad (not shown) of the semiconductor chip 200. The metal bump 210 is connected to an electrode pad (not shown) of the interconnection substrate 100a.

The underfill 220 fills a gap between the semiconductor chip 200 and the interconnection substrate 100a, and covers and protects a periphery of the metal bump 210.

The adhesive 230 is provided between the resin layer 91 and the semiconductor chip 200.

The resin layer 90 further includes a resin layer 93. The resin layer 93 fills a gap between the resin layer 91 and the interconnection substrate 100a, and covers the resin layers 91 and 92.

Figure 8A:
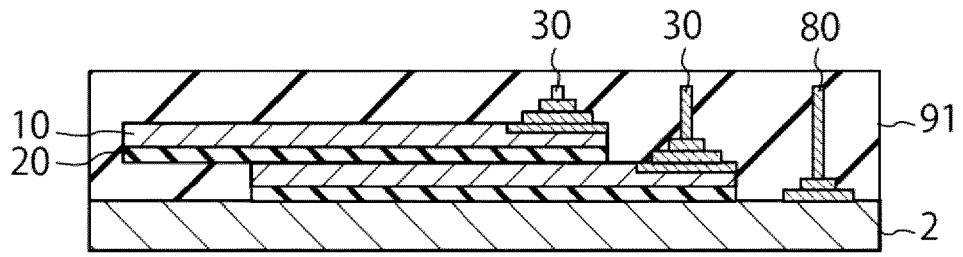
FIG. 8A is a cross-sectional view showing an example of a method for manufacturing a semiconductor device according to the fourth embodiment.
Figure 8B:
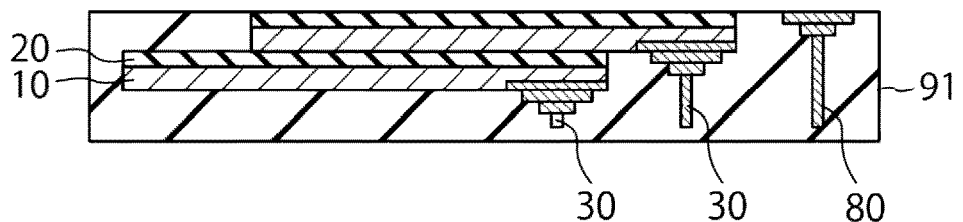
FIG. 8B is a cross-sectional view showing an example of the method for manufacturing a semiconductor device, following FIG. 8A.
Figure 8C:
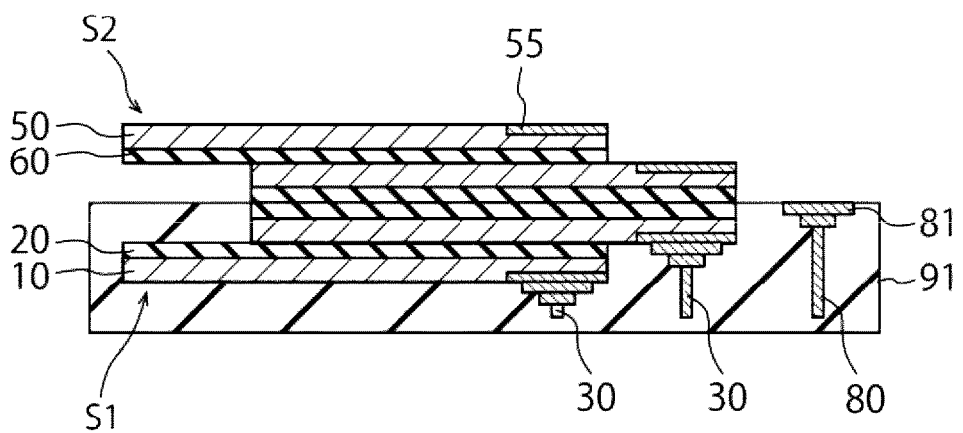
FIG. 8C is a cross-sectional view showing an example of the method for manufacturing a semiconductor device, following FIG. 8B.
Figure 8D:
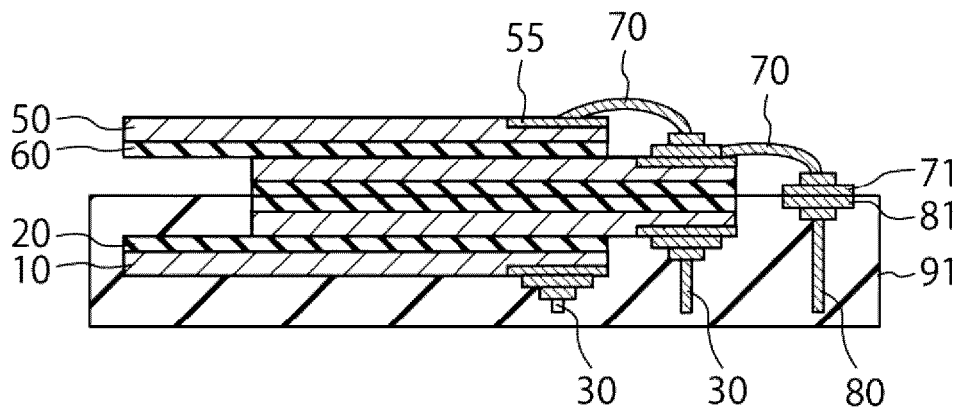
FIG. 8D is a cross-sectional view showing an example of the method for manufacturing a semiconductor device, following FIG. 8C.
Figure 8E:
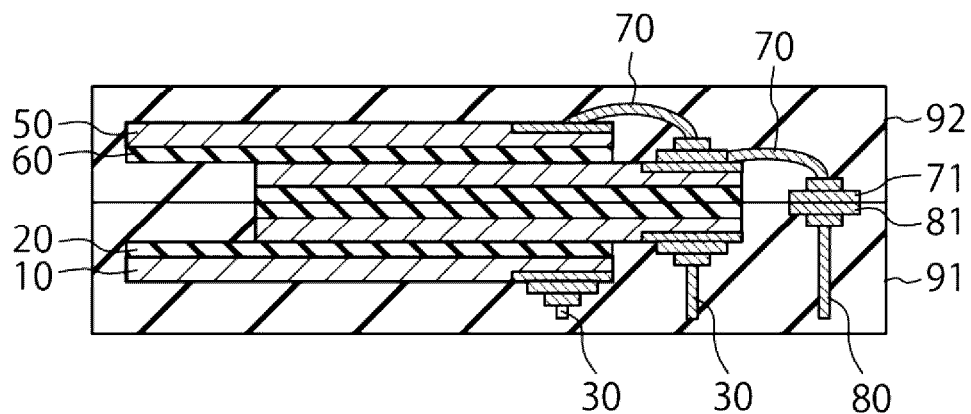
FIG. 8E is a cross-sectional view showing an example of the method for manufacturing a semiconductor device, following FIG. 8D.
Figure 8F:
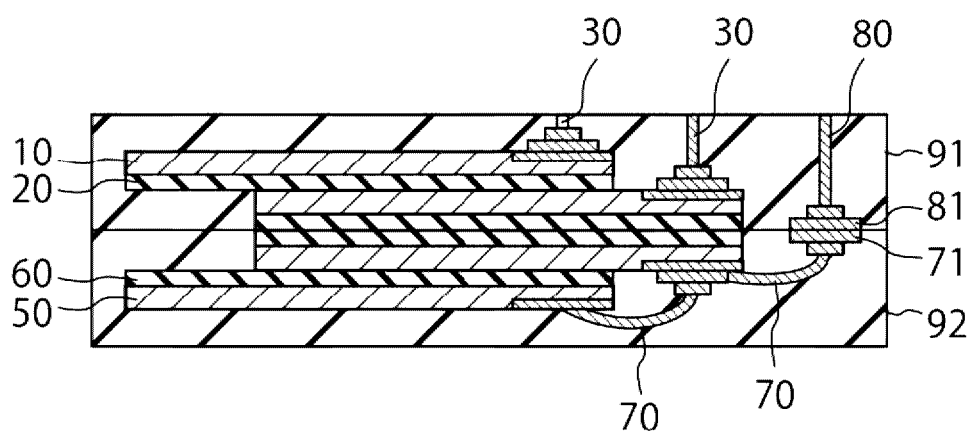
FIG. 8F is a cross-sectional view showing an example of the method for manufacturing a semiconductor device, following FIG. 8E.
Figure 8G:
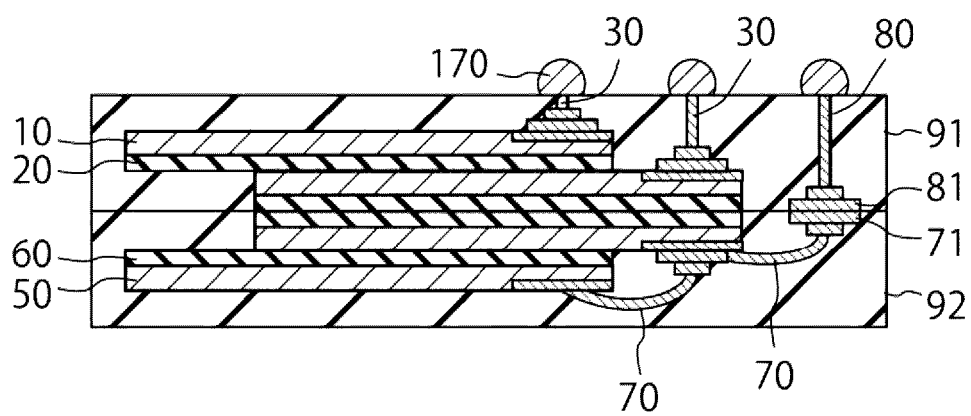
FIG. 8G is a cross-sectional view showing an example of the method for manufacturing a semiconductor device, following FIG. 8F.
Figure 8H:
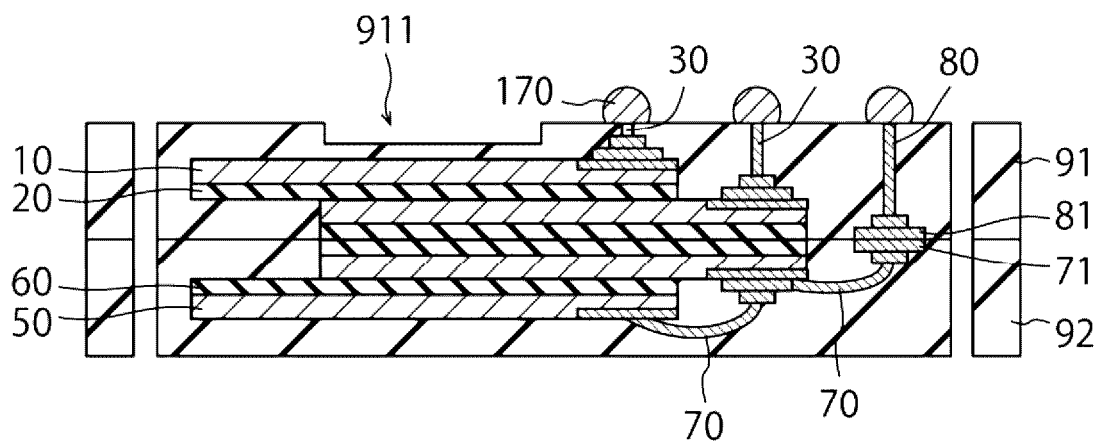
FIG. 8H is a cross-sectional view showing an example of the method for manufacturing a semiconductor device, following FIG. 8G.

Outer peripheral side surfaces of the resin layers 91 and 92 are, for example, cut surfaces by blade dicing (see FIG. 8H). The resin layers 91 and 92 each have a predetermined surface roughness on an outer periphery when viewed from the stacking direction of the stacked bodies S1 and S2. The resin layers 91 and 92 each include a filler having a surface (cut surface) along a side surface of the outer periphery on the outer periphery when viewed from the stacking direction of the stacked bodies S1 and S2. The fillers in the resin layers 91 and 92 are usually substantially spherical. When the resin layers 91 and 92 are cut or scraped, a part of the filler may be chipped. The resin layer 93 may contain a resin same as that of the resin layer 91 or the resin layer 92. The resin layer 93 may contain a resin different from that of the resin layer 91 or the resin layer 92. At this time, the resin layer 93 may be different from the resin layer 91 and the resin increase 92 in at least one of, for example, a curing shrinkage ratio, an elastic modulus, a linear expansion coefficient, and a glass transition point (Tg). The resin layer 93 may be formed of a so-called mold resin. The resin layer 93 may be different from the resin layer 91 and the resin increase 92 in a mixing ratio of the filler and the resin, a material of the filler, a shape of the filler, a diameter of the filler, and the like.

Since other configurations of the semiconductor device 1 according to the fourth embodiment is the same as corresponding configurations of the semiconductor device 1 according to the first embodiment, a detailed description thereof will be omitted.

Next, a method for manufacturing the semiconductor device 1 will be described.

FIGS. 8A to 8M are cross-sectional views showing an example of the method for manufacturing the semiconductor device 1 according to the fourth embodiment. A step shown in FIG. 8A is performed after steps same as those shown in FIGS. 2A to 2C. In the steps shown in FIGS. 2A to 2C and FIGS. 8A to 8H, only one module shown in FIG. 7 is formed. However, in the fourth embodiment, for example, a plurality of modules are formed in parallel with one support 2, and in the step shown in FIG. 8H, the module is individualized into a plurality of modules.

After the columnar electrodes 30 and 80 are formed (see FIG. 2C), as shown in FIG. 8A, the resin layer 91 is formed on the support 2.

Next, as shown in FIG. 8B, the support 2 and the peeling layer 3 are peeled off, the surface after peeling is cleaned, and the metal film 4 is removed by etching. FIG. 8B is shown upside down from FIG. 8A.

Next, as shown in FIG. 8C, the semiconductor chips 50 are stacked on the stacked body S1. Accordingly, the stacked body S2 is formed on the stacked body S1 on a side from which the support 2 is peeled off. The electrode pad 55 of each of the semiconductor chips 50 faces a direction opposite to the stacked body S1.

Next, as shown in FIG. 8D, the wires 70 are formed. The wires 70 are formed by, for example, a wire bonding method. The wires 70 electrically connect the electrode pads 55 and electrically connect the electrode pad 55 and the columnar electrode 80 (end pad 81).

Next, as shown in FIG. 8E, the resin layer 92 is formed on the resin layer 91. The resin layer 92 covers the stacked body S2.

Next, as shown in FIG. 8F, the resin layer 91 is ground such that the upper ends of the columnar electrodes 30 and 80 are exposed. FIG. 8F is shown upside down from FIG. 8E.

Next, as shown in FIG. 8G, metal bumps 170 electrically connected to the exposed columnar electrodes 30 and 80 are formed. The metal bumps 170 are used for electrical connection between the columnar electrode 80 and the metal bumps 160 in a subsequent step. The metal bumps 170 are omitted except in FIGS. 8G and 8H.

Figure 9:
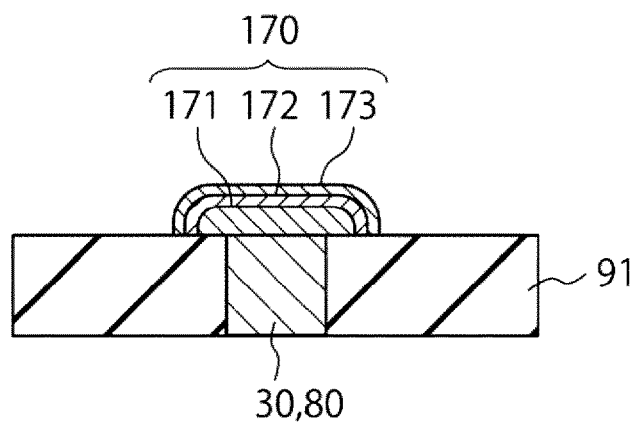
FIG. 9 is a cross-sectional view showing an example of a configuration of a metal bump according to the fourth embodiment.

FIG. 9 is a cross-sectional view showing an example of a configuration of the metal bump 170 according to the fourth embodiment.

The metal bump 170 includes a plurality of metal layers 171 to 173. For example, Ni is used as a material of the metal layer 171. For example, Pd is used as a material of the metal layer 172. For example, Au is used as a material of the metal layer 173.

Next, as shown in FIG. 8H, a recess (counterbore) 911 is formed in the resin layer 91, and the module is individualized into a plurality of modules. The recess 911 is formed for placing the semiconductor chip 200. The recess 911 is formed, for example, by forming a groove in the resin layer 91 using a dicing blade. Individualization is performed, for example, by blade dicing.

Figure 8I:
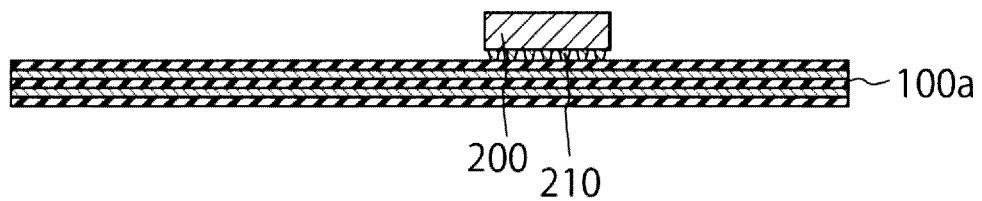
FIG. 8I is a cross-sectional view showing an example of the method for manufacturing a semiconductor device, following FIG. 8H.

Next, as shown in FIG. 8I, the semiconductor chip 200 is flip-chip connected onto the interconnection substrate 100a. The metal bump 210 is electrically connected to a pad (not shown) on the interconnection substrate 100a.

Figure 8J:
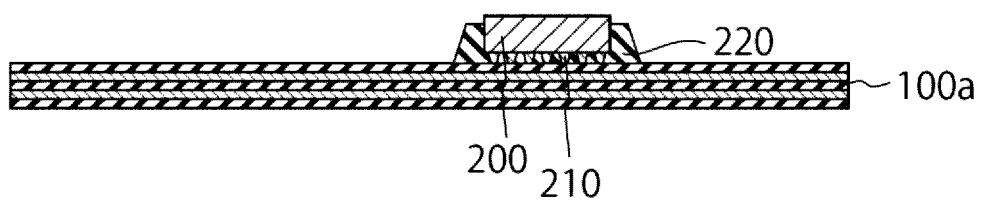
FIG. 8J is a cross-sectional view showing an example of the method for manufacturing a semiconductor device, following FIG. 8I.

Next, as shown in FIG. 8J, a gap between the semiconductor chip 200 and the interconnection substrate 100a is cleaned to form the underfill 220.

Figure 8K:
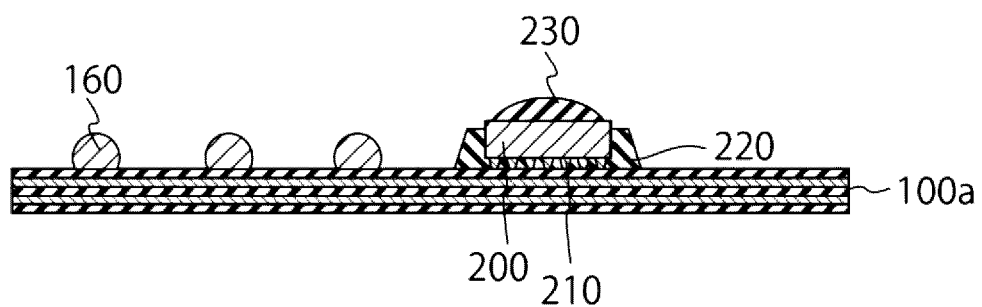
FIG. 8K is a cross-sectional view showing an example of the method for manufacturing a semiconductor device, following FIG. 8J.

Next, as shown in FIG. 8K, the metal bumps 160 are formed on the interconnection substrate 100a, and the adhesive 230 is applied on the semiconductor chip 200. As the metal bump 160, for example, a simple substance such as Sn, Ag, Cu, Au, Pd, Bi, Zn, Ni, Sb, In, and Ge, or a composite film or an alloy containing two or more kinds of these is used.

Figure 8L:
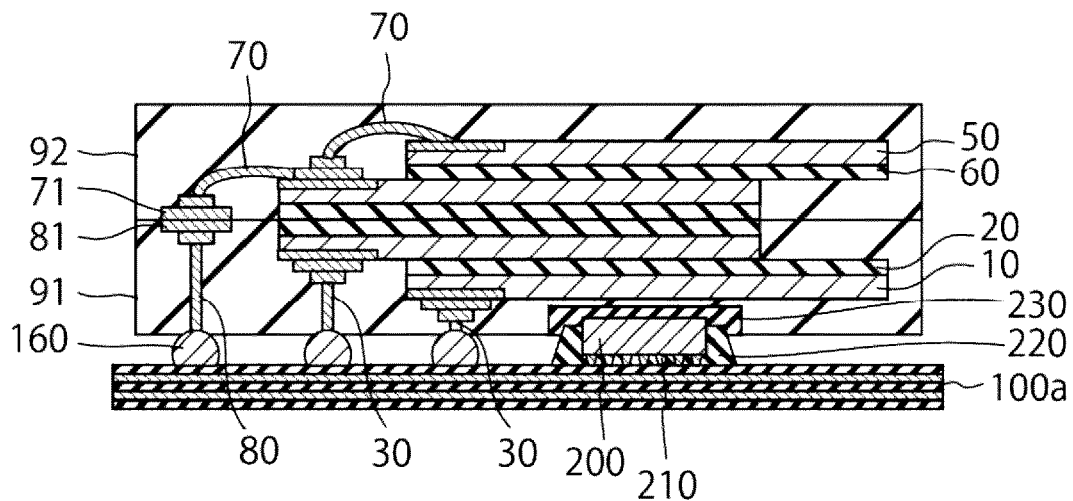
FIG. 8L is a cross-sectional view showing an example of the method for manufacturing a semiconductor device, following FIG. 8K.

Next, as shown in FIG. 8L, the modules obtained by individualization in the step shown in FIG. 8H are flip-chip connected onto the interconnection substrate 100a. The columnar electrodes 30 and 80 (metal bump 170) are electrically connected to the metal bumps 160. Here, the columnar electrodes 30 and 80 may be directly connected to the metal bumps 160 without forming the metal bumps 170. Alternatively, the metal bumps 170 may be connected to pads (not shown) of the interconnection substrate 100a without forming the metal bumps 160. As the metal bump 170, for example, a simple substance such as Sn, Ag, Cu, Au, Pd, Bi, Zn, Ni, Sb, In, and Ge, or a composite film or an alloy containing two or more kinds of these may be used.

Figure 8M:
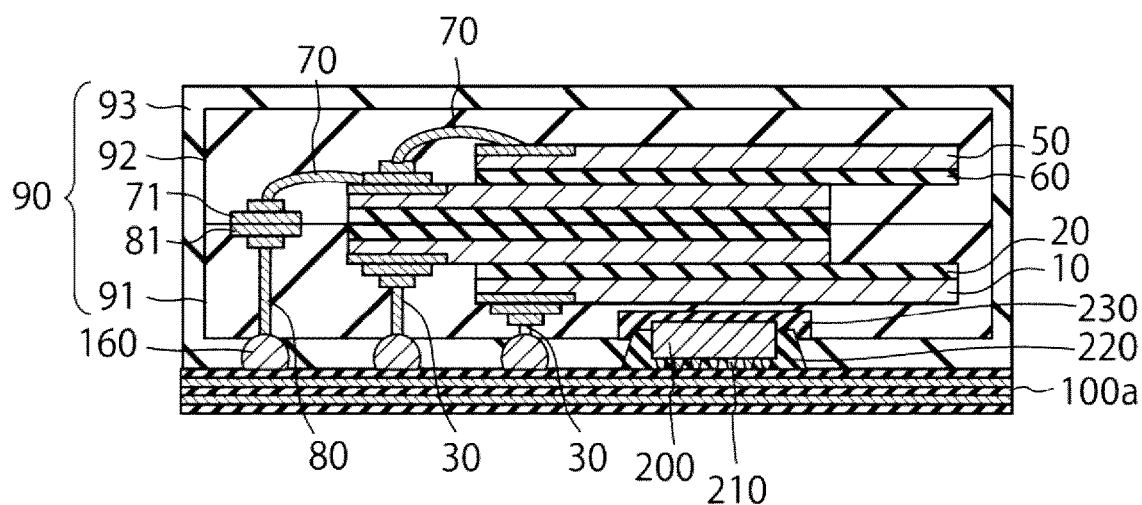
FIG. 8M is a cross-sectional view showing an example of the method for manufacturing a semiconductor device, following FIG. 8L.

Next, as shown in FIG. 8M, the resin layer 93 is formed. The resin layer 93 fills gaps between the modules obtained by individualization and the interconnection substrate 100a and covers the resin layers 91 and 92.

After the step shown in FIG. 8M, the metal bumps 150 are formed. Thus, the semiconductor device 1 shown in FIG. 7 is completed.

The steps shown in FIGS. 8I to 8K do not necessarily have to be performed after the step shown in FIG. 8H.

As in the fourth embodiment, the interconnection substrate 100a may be provided instead of the redistribution layer 100, and the semiconductor chip 200 may be further provided. The semiconductor device 1 according to the fourth embodiment can obtain the effect same as that of the first embodiment. The semiconductor device 1 according to the fourth embodiment may be combined with that according to the second embodiment or the third embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first stacked body provided above a substrate, and including a plurality of first semiconductor chips stacked on top of one another;
a second stacked body provided further above the first stacked body, and including a plurality of second semiconductor chips stacked on top of one another, wherein the first semiconductor chips each have a first pad facing toward the substrate, and the second semiconductor chips each have a second pad facing away from the substrate;
a first resin layer provided on the substrate and covering the first stacked body; and
a second resin layer provided on the first resin layer and covering the second stacked body, wherein
the first resin layer and the second resin layer are different in at least one of a curing shrinkage ratio, an elastic modulus, a linear expansion coefficient, or a glass transition point.

2. The semiconductor device according to claim 1, further comprising:
a first columnar electrode extending from the substrate toward the second stacked body; and
a first wire electrically coupling the second pad to the first columnar electrode.

3. The semiconductor device according to claim 2, wherein
the first columnar electrode has a first end pad disposed opposite the first stacked body from the substrate,
the first wire has a second end pad in direct contact with the first columnar electrode, and
a width of the first end pad is different from a width of the second end pad.

4. The semiconductor device according to claim 2, wherein
the first columnar electrode penetrates the first resin layer and extends to a boundary between the first resin layer and the second resin layer.

5. The semiconductor device according to claim 2, further comprising:
a second columnar electrode extending between the first pad and the substrate.

6. The semiconductor device according to claim 1, further comprising:
a second wire electrically coupling the first pad of one of the first semiconductor chips, the first pad of another of the first semiconductor chips, and a first columnar electrode to one another, wherein the first columnar electrode extends from the substrate toward the second stacked body.

7. The semiconductor device according to claim 1, wherein the second pads are disposed on a second side of the second semiconductor chips, which is on a first side where the first pads are disposed in the first semiconductor chips.

8. The semiconductor device according to claim 1, wherein the second pads are disposed on a fourth side of the second semiconductor chips, which is on a third side opposite to a first side where the first pads are disposed in the first semiconductor chips.

9. The semiconductor device according to claim 1, wherein the first resin layer and the second resin layer each have a predetermined surface roughness around an outer periphery.

10. The semiconductor device according to claim 1, wherein the first resin layer and the second resin layer each include a filler having a surface along a side surface of an outer periphery.

11. The semiconductor device according to claim 1, wherein the second stacked body is in contact with the first stacked body.

12. A method for manufacturing a semiconductor device, comprising:
forming, on a support, a first stacked body including a plurality of first semiconductor chips stacked on top of one another, wherein respective first pads of the first semiconductor chips face a first direction extending away from the support;
forming a first resin layer covering the first stacked body;
removing the support;
forming, on a side where the support is removed, a second stacked body to contact the first stacked body, the second stacked body including a plurality of second semiconductor chips stacked on top of one another, wherein respective second pads of the second semiconductor chips face a second direction opposite to the first direction;
forming a first columnar electrode extending from the support in a stacking direction of the first stacked body after the first stacked body is formed; and
forming a first wire electrically coupling the first pad of one of the first semiconductor chips, the first pad of another of the first semiconductor chips, and the first columnar electrode to one another.

13. The method for manufacturing a semiconductor device according to claim 12, further comprising:
forming a second wire electrically connecting at least one of the second pads to the first columnar electrode after the second stacked body is formed.

14. The method for manufacturing a semiconductor device according to claim 12, further comprising:
forming a second resin layer provided on the first resin layer and covering the second stacked body, wherein
the first resin layer and the second resin layer are different in at least one of a curing shrinkage ratio, an elastic modulus, a linear expansion coefficient, or a glass transition point.

15. A method for manufacturing a semiconductor device, comprising:
forming, on a support, a first stacked body including a plurality of first semiconductor chips stacked on top of one another, wherein respective first pads of the first semiconductor chips face a first direction extending away from the support;
forming a first resin layer covering the first stacked body;
removing the support;
forming, on a side where the support is removed, a second stacked body to contact the first stacked body, the second stacked body including a plurality of second semiconductor chips stacked on top of one another, wherein respective second pads of the second semiconductor chips face a second direction opposite to the first direction; and forming a second resin layer provided on the first resin layer and covering the second stacked body, wherein the first resin layer and the second resin layer are different in at least one of a curing shrinkage ratio, an elastic modulus, a linear expansion coefficient, or a glass transition point.

\* \* \* \* \*